US011029891B2

(12) United States Patent
Surcouf et al.

(10) Patent No.: US 11,029,891 B2
(45) Date of Patent: Jun. 8, 2021

(54) HYBRID DISTRIBUTED STORAGE SYSTEM TO DYNAMICALLY MODIFY STORAGE OVERHEAD AND IMPROVE ACCESS PERFORMANCE

(71) Applicant: Cisco Technology, Inc., San Jose, CA (US)

(72) Inventors: Andre Jean-Marie Surcouf, St Leu la Foret (FR); Guillaume Ruty, Paris (FR); Mohammed Joseph Hawari, Montigny-le-bretonneux (FR); Aloys Augustin, Paris (FR)

(73) Assignee: CISCO TECHNOLOGY, INC., San Jose, CA (US)

( * ) Notice: Subject to any disclaimer, the term of this patent is extended or adjusted under 35 U.S.C. 154(b) by 29 days.

(21) Appl. No.: 16/181,639

(22) Filed: Nov. 6, 2018

(65) Prior Publication Data

US 2020/0142634 A1 May 7, 2020

(51) Int. Cl.
*G06F 12/00* (2006.01)
*G06F 3/06* (2006.01)
*G06F 11/10* (2006.01)
*H03M 13/15* (2006.01)

(52) U.S. Cl.
CPC ............ *G06F 3/067* (2013.01); *G06F 3/0604* (2013.01); *G06F 3/0659* (2013.01); *G06F 11/1076* (2013.01); *H03M 13/154* (2013.01)

(58) Field of Classification Search
None
See application file for complete search history.

(56) References Cited

U.S. PATENT DOCUMENTS

| 9,645,885 | B2 | 5/2017 | De Schrijver et al. |
| 2011/0040792 | A1* | 2/2011 | Perry ............... G06F 16/1844 707/783 |
| 2015/0248253 | A1* | 9/2015 | Kim ................. G06F 3/0611 707/723 |
| 2016/0335158 | A1* | 11/2016 | De Schrijver ...... G06F 11/1076 |
| 2018/0203866 | A1 | 7/2018 | Surcouf et al. |

OTHER PUBLICATIONS

Gae-won You et al., "Scalable Load Balancing in Cluster Storage Systems", F. Kon and A.-M. Kermarrec (Eds.): Middleware 2011, LNCS 7049, IFIP International Federation for Information Processing 2011, pp. 101-122, Dec. 12-16, 2011, 22 pages.

(Continued)

*Primary Examiner* — Daniel D Tsui
(74) *Attorney, Agent, or Firm* — Edell, Shapiro & Finnan, LLC

(57) ABSTRACT

Techniques are provided for storing data in a distributed storage system. A server stores an object according to a first storage policy in the distributed storage system that includes a plurality of storage nodes. Storing the object according to the first storage policy results in a first storage overhead for the object. The server receives a triggering event associated with the object, and the triggering event changes an attribute of the object. In response to the triggering event, the server identifies a second storage policy for the object. Storing the object according to the second storage policy results in a second storage overhead for the object different from the first storage overhead.

14 Claims, 11 Drawing Sheets

(56) References Cited

OTHER PUBLICATIONS

Mahdi Jafari Siavoshani, et al., "Storage, Communication, and Load Balancing Trade-off in Distributed Cache Networks", arXiv:1706.10209v1 [cs.IT], Jun. 30, 2017, 15 pages.

Roy Friedman et al., "Combining Erasure-Code and Replication Redundancy Schemes for Increased Storage and Repair Efficiency in P2P Storage Systems", Technion—Computer Science Department—Technical Report CS, Mar. 2013, 10 pages.

Julio Araujo et al., "Hybrid Approaches for Distributed Storage Systems", Fourth International Conference on Data Management in Grid and P2P Systems (Globe 2011), Sep. 2011, 13 pages.

Huanchen Zhang et al., "Reducing the Storage Overhead of Main-Memory OLTP Databases with Hybrid Indexes", SIGMOD'16, Jun. 26-Jul. 1, 2016, 15 pages.

Miguel Castro et al., "HAC: Hybrid Adaptive Caching for Distributed Storage Systems", Proceedings of the ACM Symposium on Operating System Principles (SOSP '97), Saint-Malo, France, Oct. 1997, 18 pages.

Bo Mao et al., "Improving Storage Availability in Cloud-of-Clouds with Hybrid Redundant Data Distribution", IEEE 29th International Parallel and Distributed Processing Symposium, Jul. 20, 2015, 10 pages.

\* cited by examiner

HYBRID DISTRIBUTED STORAGE SYSTEM TO DYNAMICALLY MODIFY STORAGE OVERHEAD AND IMPROVE ACCESS PERFORMANCE

TECHNICAL FIELD

The present disclosure relates to a hybrid distributed storage system to dynamically modify storage overhead and improve access performance.

BACKGROUND

In a distributed storage system, data is usually replicated on several storage nodes to ensure reliability when failures occur. One of the main costs of distributed storage systems is the raw storage capacity. This cost increases when the quality and performance of the devices used increase. Furthermore, the global amount of data produced and stored by mankind increases faster than the average storage device capacity at equal cost.

A storage cluster that includes multiple storage nodes can be employed to store data. To provide business continuity and disaster recovery, data may be stored in several storage clusters such that if one of the clusters fails, the data may still be accessed from the other cluster. Nevertheless, the challenge remains to reduce storage overhead in a distributed storage system.

DESCRIPTION OF EXAMPLE EMBODIMENTS

Overview

Figure 1:
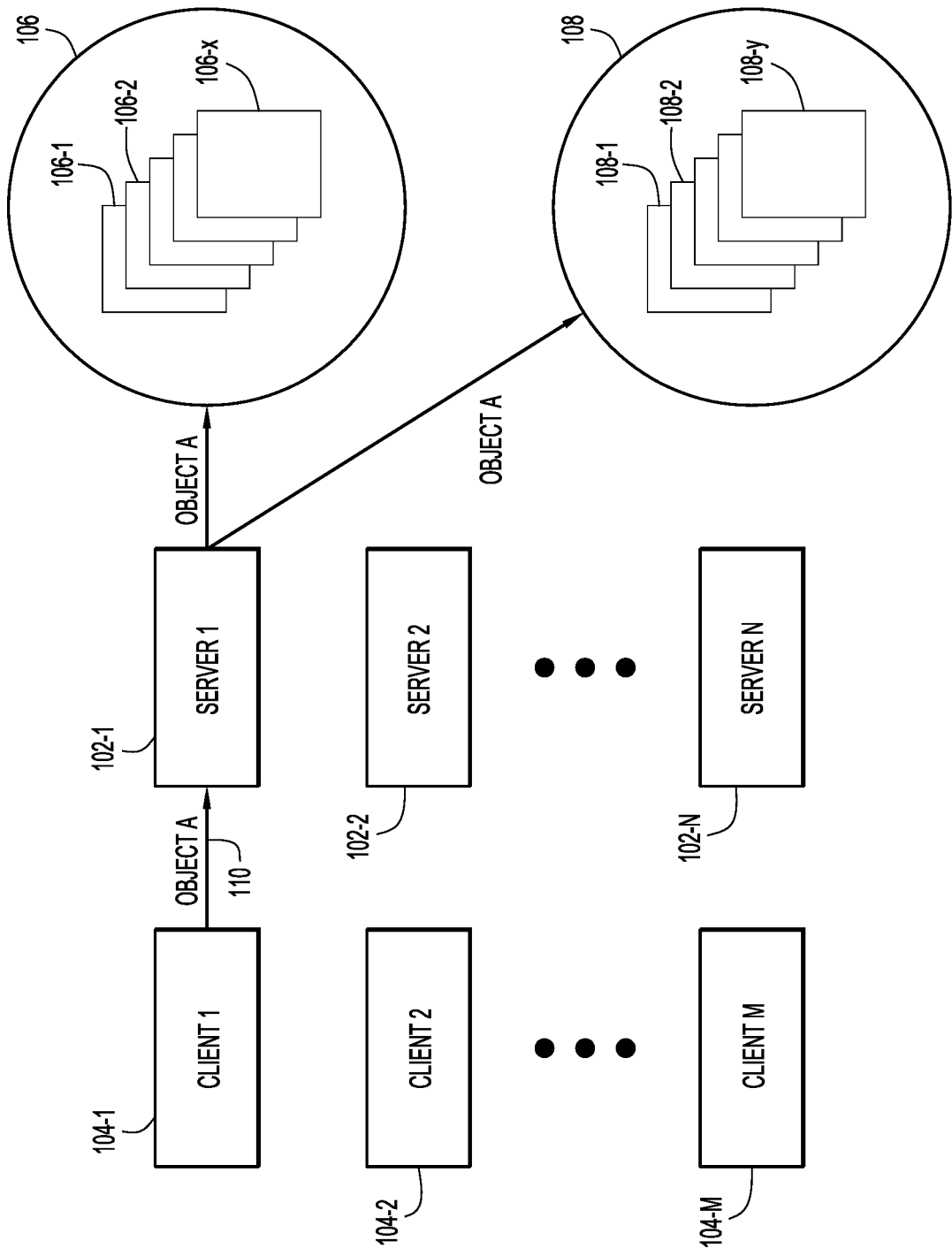
FIG. 1 depicts a hybrid distributed storage system in which objects are dynamically stored according to policies, according to one example embodiment.

Techniques are provided for storing data in a distributed storage system. An object is stored according to a first storage policy in the distributed storage system that includes a plurality of storage nodes. Storing the object according to the first storage policy results in a first storage overhead for the object. A triggering event associated with the object is received, and the triggering event changes an attribute of the object. In response to the triggering event, a second storage policy for the object is identified. Storing the object according to the second storage policy results in a second storage overhead for the object different from the first storage overhead.

Example Embodiments

Generally, there are two main techniques to protect stored data. According to a first technique, data is replicated to several locations, with a configurable replication factor, which according to industry standard is at least three in order to be resilient to two simultaneous random failures. A storage overhead of a distributed storage system is defined as the ratio of the storage capacity used to store an object to the size of the object itself. If a data is replicated to produce three copies, the storage overhead is three. According to a second technique, data can be erasure coded. In erasure coding, the data is split into smaller chunks that are encoded to produce parity chunks. For example, one erasure coding standard calls for splitting the data into ten chunks and producing four parity chunks. In this case, the storage overhead is 1.4.

When data is erasure coded, the storage overhead is generally lower (1.4 for a standard 10-4 erasure code instead of 3 for 3 replicas). However, writing and retrieving the data when employing erasure coding techniques can be slower for two reasons. First, the encoding of the data chunks takes computation time to complete. Second, more storage nodes are needed to participate in the storage process. For example, for a write operation (for a 10-4 erasure code), fourteen nodes are involved instead of three nodes for replication. The write operation uses fourteen nodes instead of three nodes. The read operation is also more complex for the erasure coding model since the erasure coding model needs ten nodes (out of fourteen) to participate instead of one node (out of three) in the replication model. The performance difference between erasure coding and replication models also depends on the chosen storage technology, such as non-volatile random-access memory (NVRAM), solid state drive (SSD), spinning disk, etc.

To balance the tradeoff between performance and storage overhead, techniques disclosed herein provide storage systems that can be dynamically configured to store objects by replication, erasure coding, or a combination thereof.

In one embodiment, the proposed storage system is configured to dynamically adapt storage for each individual object to have a high storage efficiency such that most objects have a low storage overhead and the most popular objects have a high storage overhead, but are fast to access.

In one embodiment, a policy driven distributed storage system is employed where objects are initially stored by erasure coding or replication depending on the policy. Policies can be generated based on static information such as an object size, an object type, an object reliability requirement, object nature, an object application-requested quality of service (QoS), predetermined read or write performance, etc. and/or based on dynamic information such as an object popularity, an object update rate, a time since object creation, a cluster load, a storage node load, etc.

Reference is made first to FIG. 1. FIG. 1 depicts a hybrid distributed storage system 100, according to one example embodiment. The system 100 includes servers 102-1 through 102-N (collectively 102), client devices 104-1 through 104-M (collectively 104), a first plurality of storage nodes 106-1 through 106-x, and a second plurality of storage nodes 108-1 through 108-y. In some embodiments, the first plurality of storage nodes 106-1 through 106-x may form a first storage cluster 106. The second plurality of storage nodes 108-1 through 108-y may form a second storage cluster 108. It is to be understood that any suitable number of clients, servers, and storage nodes may be included in the system 100, and any number of storage nodes can be included in a storage cluster.

Each of the clients 104 can send a request for storing an object to one of the servers 102. Each of the clients 104 can send a request for retrieving an object to a server that manages the storage of, and access to, the object. In some embodiments, the system 100 is configured to handle a per-object storage configuration. In system 100, each object is assigned to a single server which is responsible for determining how and where to store the object. In one embodiment, the storage decisions can be made according to information about the object and information gathered from all the servers that host the object.

In some embodiments, each of servers 102 maintains a policy database that stores policies for storing objects in the storage clusters 106 and 108. For example, the client 104-1 may send a request 110 for storing object A to the server 102-1. Upon receipt of the request, the server 102-1 may extract one or more attributes of the object A and find a policy in the policy database based on the extracted attributes to store the object A. For example, an attribute of the object A can be its size or popularity. A policy, which can be a default policy for any object managed by the server 102-1, may define a cost structure for storing objects. Upon receipt of the object, the server 102-1 assigns a cost score to the object A based on the cost structure. Based on the cost score of the object A, the server 102-1 determines a storage method for storing the object.

In one embodiment, the default policy for server 102-1 may indicate that if a size of an object exceeds a predetermined size threshold, the object is to be stored by erasure coding, and that if the size of the object is equal to or less than the size threshold, the object is to be stored by replication, e.g., three replicas of the object stored in different nodes. For example, after receiving the request for storing the object A from the client 104-1, the server 102-1 determines and compares the size of the object A to the size threshold. If the size of the object A exceeds the size threshold, the server 102-1 uses erasure coding to, for example, split the object A into ten fragments and generate four parity fragments, and stores the fragments at, for example, fourteen different storage nodes in cluster 106, resulting in a storage overhead of 1.4. Other erasure coding mechanisms may be employed, which may result in a different storage overhead greater or less than 1.4. If the size of the object A is equal to or less than the size threshold, the server 102-1 stores the object A as three replicas at three different storage nodes in for example, cluster 108, resulting in a storage overhead of 3. In general, a storage overhead for an erasure coding mechanism is less than that for three replicas.

In some embodiments, policies may indicate that when an object is stored by erasure coding, the node or nodes that will store the fragments of the object have a slower response speed, whereas when an object is stored by replication, the node or nodes that will store the replicas have a higher response speed. For example, each of the servers 102 may maintain a performance and capacity database of the storage nodes. An entry in the performance and capacity database for a storage node may include the speed of processor, the size of the storage medium, the free space on the storage medium, the type of the storage medium (e.g., SSD or hard drive), or the load of the storage node. When an object is to be stored by erasure coding, the server can select fourteen nodes that have a slower response speed based on the performance and capacity database. Moreover, when an object is to be stored by replication, the server can select three nodes to store the replicas that have a response speed faster than that of the nodes used for erasure coding, based on the performance and capacity database.

In some embodiments, a default policy may indicate that when an object is stored in the system, it is initially erasure coded so that the default configuration results in a low storage overhead, e.g., 1.4. The default policy can be overwritten for some classes of objects. For example, when performance is important at the application level, an object may be stored by replication or in a fast storage medium despite that the default policy calls for erasure coding.

In some embodiments, a default policy may be based on the popularity of the objects. For example, an object received for storage may include its popularity information, e.g., a popularity score. A default policy may dictate that if the popularity score of the object is less than a threshold, the object is to be stored by erasure coding, and if the popularity score of the object is equal to or greater than the threshold, the object is to be stored by replication. In one embodiment, the popularity of an object can be determined by least recently used (LRU) or least recently and frequently used (LRFU) index. The servers 102 in the storage system may maintain a LRFU structure of objects for which the servers are responsible. The servers 102 keep a record of which objects are in this structure, as well as when and how many times the objects have been accessed since they have been in the structure. In one embodiment, the structure that stores the popularity scores of the objects may include two or more classes for determining storage methods for the objects. For example, a server may maintain a popularity database that records the changes of popularity score of the objects the server manages. A policy for storing the objects may define a first popularity threshold. If the popularity score of an object is less than the first popularity threshold, the object is assigned to a less-popular class such that the object is to be stored by erasure coding, resulting in a lower storage overhead, e.g. 1.4. If the popularity score of an object is equal to or greater than the first popularity threshold, the object is assigned to a popular class such that the object is to be stored by replication, resulting in a greater storage overhead, e.g., 3.

In some embodiments, the policy for storing the objects may further define a second popularity threshold greater than the first popularity threshold such that the objects are assigned to three different classes. When a popularity score of an object is equal to or greater than the second popularity threshold, the object is assigned to a most popular class. For example, objects in the least popular class are stored by erasure coding having a storage overhead of 1.4, objects in the popular class are stored by both erasure coding and replication (one replica) having a storage overhead of 2.4, and objects in the most popular class are stored by replication (three replicas) having a storage overhead of 3.

In some embodiments, the threshold(s) is/are configurable. For example, based on a triggering event in the storage system, a server may modify a policy to change the threshold(s) or identify a new policy that indicates a different threshold. After an object is initially stored in a storage cluster according to the default policy, the server may receive a triggering event associated with the object to identify or generate a new policy to store the object. The triggering event changes one or more attributes of the object. In response to the triggering event, the server identifies or generates a new storage policy for storing the object. The object is then stored according to the new policy.

For example, the triggering event changes an attribute of the object such that the attribute of the object is greater or less than a predetermined threshold. In response to the triggering event, the object is stored according to the new storage policy. In one embodiment, the server may store an additional copy or delete an existing copy of the object according to the new policy. In one embodiment, the additional copy of the object is stored by replication at a node having a response speed greater than a node that stores the existing copy of the object. These techniques allow the server to dynamically manage the storage of objects to reduce storage overhead and/or improve performance of the storage system.

Figure 2A:
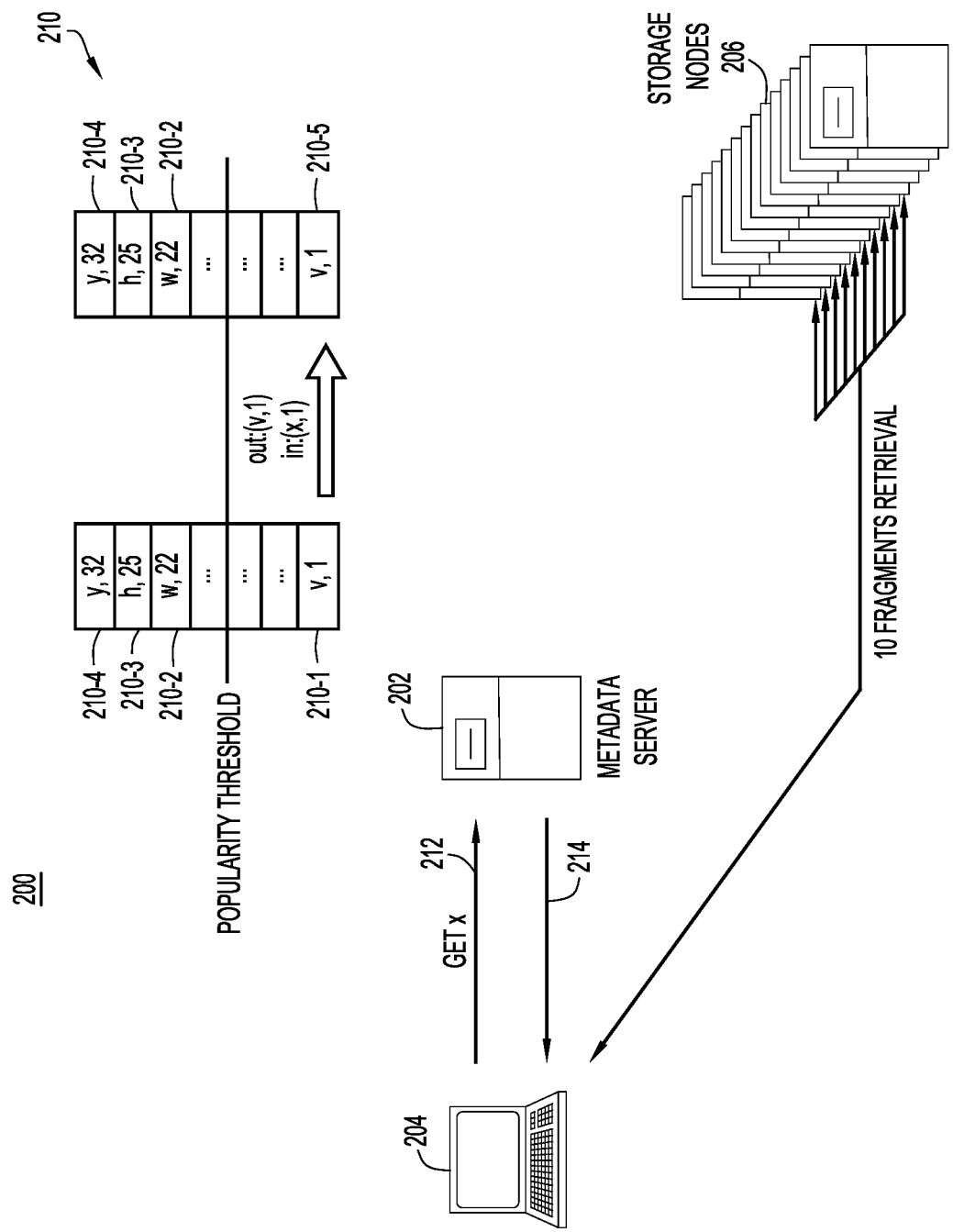
FIGS. 2A-2E illustrate operations performed by a hybrid distributed storage system to dynamically manage the storage of objects based on popularity of the objects, according to one example embodiment.

FIGS. 2A-2E illustrate operations of a hybrid storage system 200 that includes a server that dynamically manages the storage of objects based on popularity of the objects, according to an example embodiment. Reference is first made to FIG. 2A. The hybrid storage system 200 includes a server 202, a client 204, and a plurality of storage nodes 206. The server 202 is configured to manage storage of, and access to, objects stored in the storage nodes 206. For example, the server 202 may store all objects managed by it at the storage nodes 206 according to a default policy. In one embodiment, the default policy indicates that all received objects are stored by erasure coding to keep storage overhead low. In addition, the server 202 maintains a popularity database 210 that keeps track of popularity changes of the objects. For example, the popularity database 210 may have entries that include object names (v, . . . w, h, y, x) and a number of times each of the objects has been retrieved, e.g., a popularity score. As shown in FIG. 2A, entry 210-1 in the popularity database 210 for object v indicates that it has been retrieved once (v,1) in the past. Similarly, entries 210-2 to 210-4 indicates that objects w, h, and y have been retrieved 22, 25, and 32 times, respectively. A policy for the server 202 includes a popularity threshold (≥20) for storing the objects. The policy indicates that if a number of retrieval times of an object is less than 20 (less popular object), the object is stored by erasure coding, and if a number of retrieval times of an object is equal to or greater than 20 (popular object), the object is stored by both erasure coding in slower nodes and a replica in a faster node. According to this policy, the object v is stored by erasure coding while the objects w, h, and y are stored by both erasure coding and replication (one replica for each).

In one embodiment, the client 204 may send to the server 202 a request 212 for retrieving an object x. The object x is stored by erasure coding according to the default storage policy such that the object x is split, for example, into 10 fragments and stored in 10 different storage nodes 206. In response to the request 212, the server 202 transmits a response 214 to the requesting client 204 that includes fragments identifiers and the identities and/or addresses of the storage nodes that store the fragments. The server 202 also updates the popularity database 210 based on the request 212. For example, the request 212 is the first ever request for retrieving the object x since the object is stored by the server 202 at the storage nodes 206. In response to the request 212, the server 202 saves an entry (x,1) shown at 210-5 in the popularity database 210. In one embodiment, the server 202 deletes entry 210-1 for the object v as entry 210-1 indicates that object v is as popular as object x (both have been retrieved once) but the entry 210-1 is older than the entry 210-5. The client 204, based on the response 214, can retrieve (at 216) object x from the storage nodes that store the fragments of the object x.

Figure 2B:
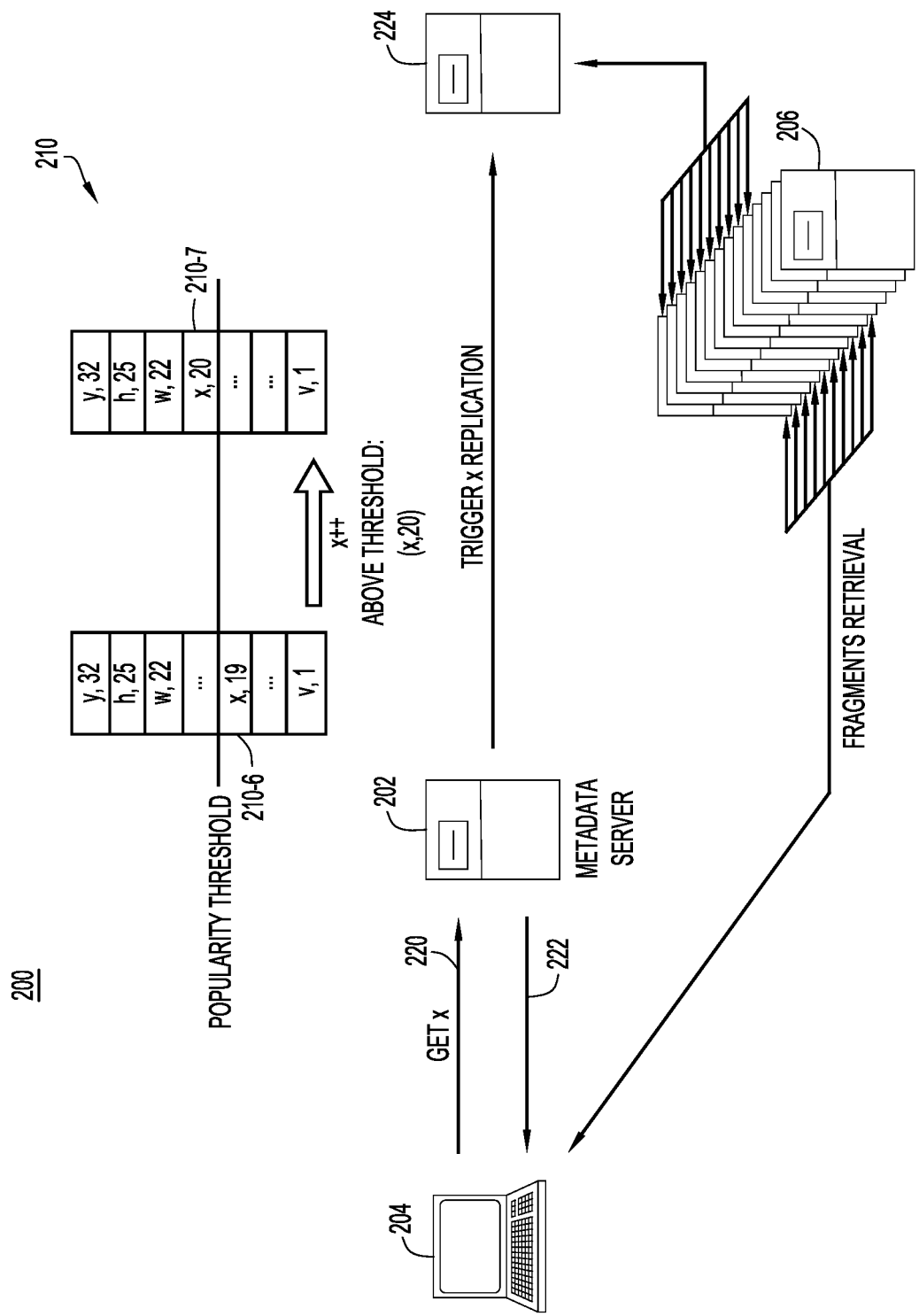

As the popularity of the object grows, the server 202 may generate or identify a new policy different from the default policy to store the object. An example is shown in FIG. 2B. In FIG. 2B, before the server 202 receives another request 220 to retrieve the object x from a same client 204 or a different client, an entry 210-6 for the object x indicates that it has been retrieved 19 times (x,19). After receiving the request 220, the server 202 transmits to the requesting client 204 a response 222 that includes fragments identifiers of the object x and the identities and/or addresses of the nodes that store the fragments. Moreover, the server 202 updates the popularity database 210 by adding an entry (x,20) shown at 210-7 and identifies a second policy indicating that if an object is retrieved for 20 or more times, a copy of the object, e.g., a replica, is to be stored in a different storage node. The server 202 may search its performance and capacity database to identify a storage node 224 to store the replica of object x. For example, the server 202 may determine that the storage node 224 is a fast response node or has a load lower than a threshold so that the storage node 224 satisfies the performance and capacity requirements for storing the replica of the object x.

In one embodiment, the server 202 may instruct (at 226) the storage node 224 to retrieve (at 227) the fragments of the object x from storage nodes 206 to construct a replica of the object x. Once the replica is stored at the storage node 224, the object x is stored by both erasure coding and replication due to its increased popularity. When the object becomes popular, a replica of the object can be stored in the system 200 so that clients can directly access it. As a result, while the object is popular, its storage overhead is 2.4 (one replica plus a copy in erasure coding) instead of 1.4 (erasure coding). Furthermore, the storage node 224 chosen to host (store) the full replica can be selected among nodes that have a lower than average cluster request load or a faster storage device. That is, the storage node 224 can act as a system-wide cache for the object. In the meantime, based on the response 222, the client 204 starts to retrieve (at 228) object x from the storage nodes 206 that store the fragments of the object x.

Figure 2C:
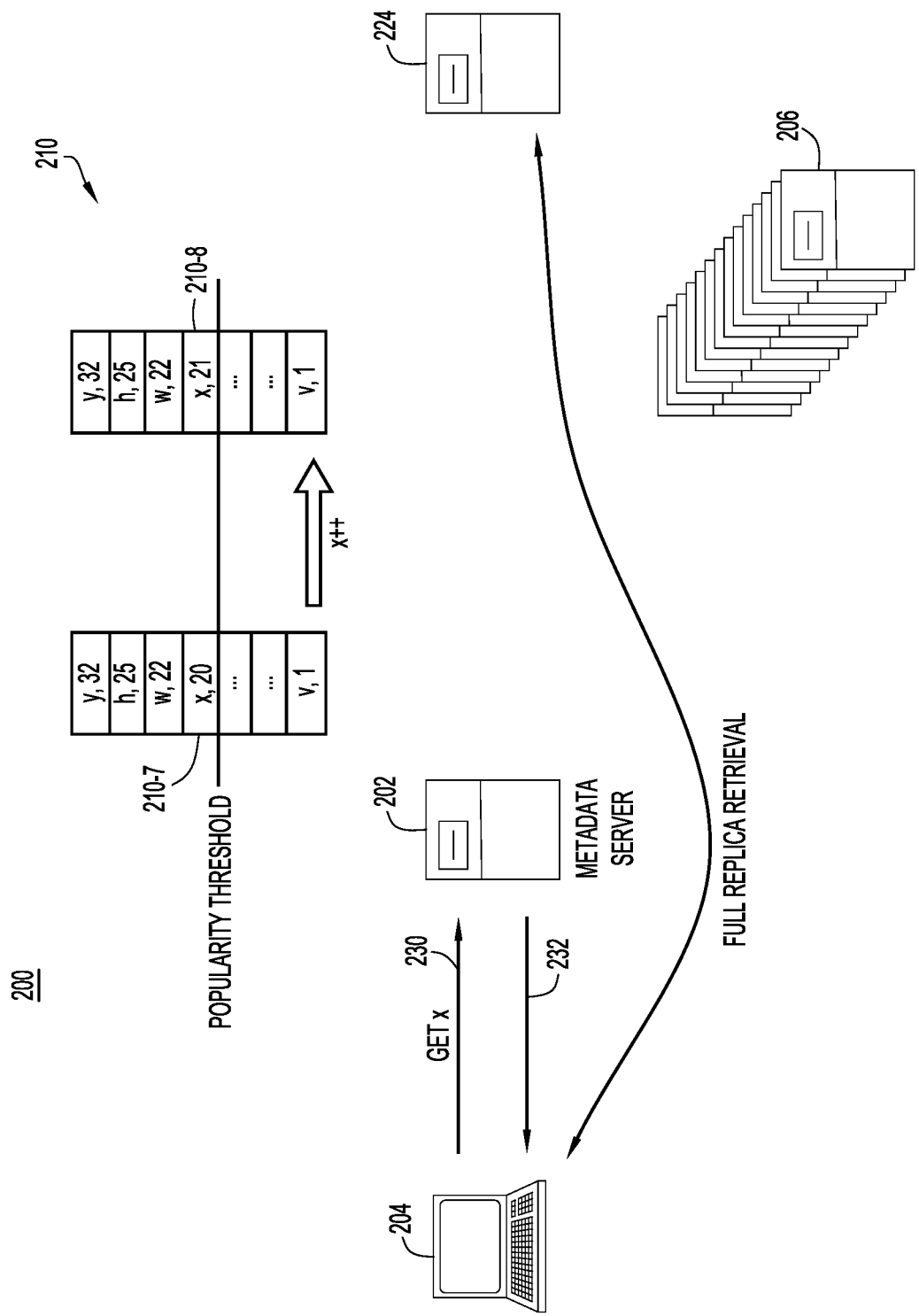

Referring to FIG. 2C, when a subsequent request 230 for retrieving the object x is received at the server 202, the server 202 returns with a response 232 that includes the identity and location/address of the storage node 224 that stores the replica of the object x. Moreover, the server 202 updates the popularity database 210 by adding an entry (x,21) shown at 210-8. Based on the response 232, the client 204 can retrieve (at 234) the object x from the storage node 224. Because retrieving a replica requires less computation than an erasure-coded copy of the object, the user experience is improved as the popularity of the object increases. This system not only reduces storage overhead by initially erasure coding a less popular object, but also improves system performance by dynamically adding a replica when the object becomes popular.

Figure 2D:
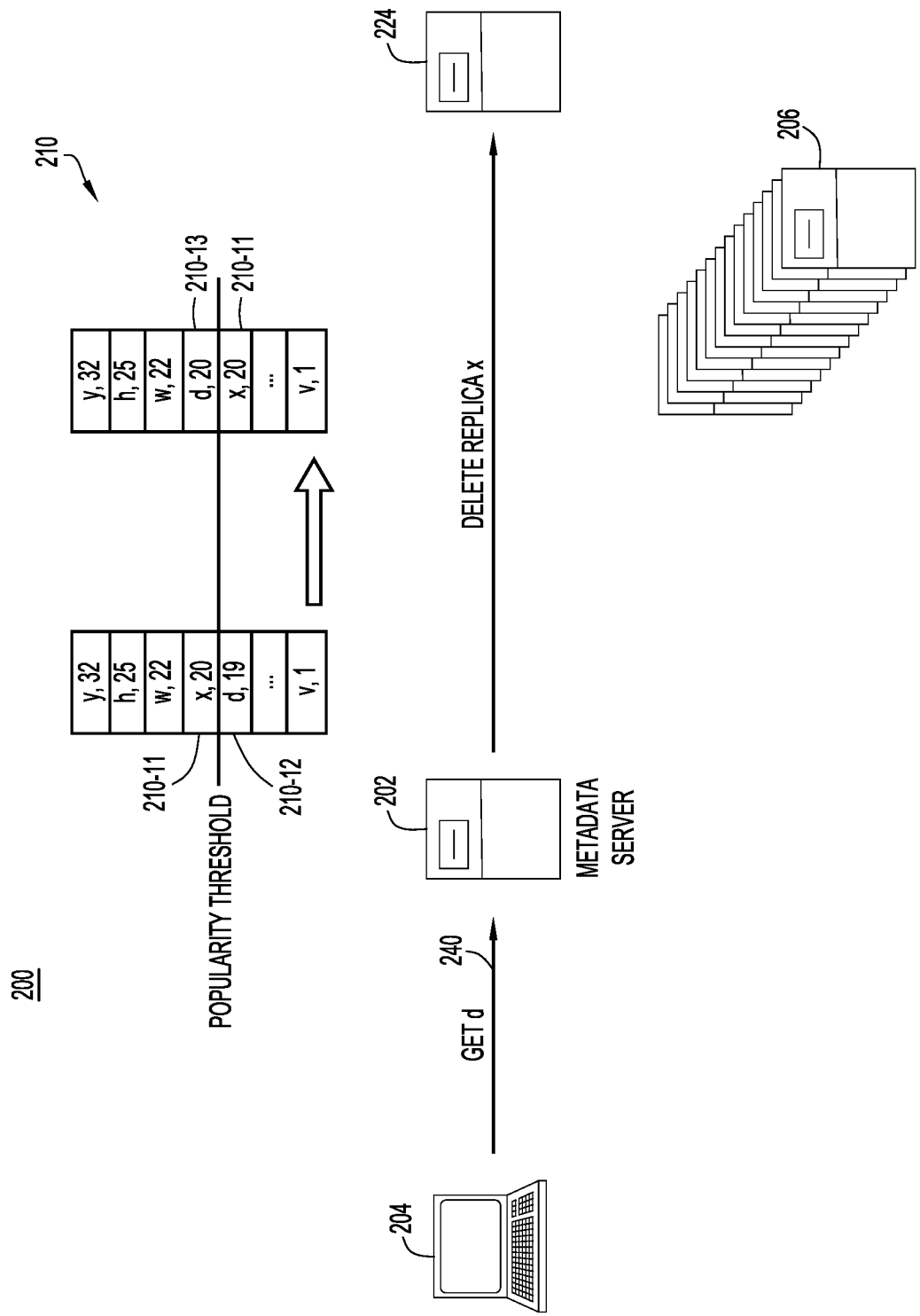

In some embodiments, an object previously popular may become less popular, and the server that manages the object may dynamically change the method to store the object. Reference is made to FIG. 2D. Before the server 202 receives a request 240 from the client 204 to retrieve object d, the popularity database 210 includes entries 210-11 and 210-12 for objects x and d, respectively. This indicates that the popularity of the object x is above the popularity threshold and that the popularity of the object d is below the popularity threshold. Based on the popularity policy, this means that a replica of the object x, in addition to an erasure-coded copy, is stored in the system 200 while the object d is stored by erasure coding. Upon receiving the request 240 for retrieving the object d, the server 202 updates the popularity database 210 to add an entry 210-13 (d,20) that pushes the popularity of the object d above the popularity threshold. The server 202 moves the entry 210-11 for the object x below the popularity threshold because although both objects x and d have been retrieved 20 times, the latest request is asking for object d. The policy governing the popularity indicates that a replica of the object d should now be provided since the popularity score of the object d exceeds the popularity threshold. Moreover, because the popularity score of the object x is below the popularity threshold, the replica of the object x stored in the system 200 is to be deleted. Based on the policy, the server 202 instructs (at 242) the storage node, e.g., storage node 224 that stores the replica of the object x, to delete the replica, resulting in a reduced storage overhead of 1.4 for the object x. The server 202 further instructs a storage node, e.g., storage node 224, to retrieve erasure-coded fragments of the object d from nodes 206 to construct a replica of the object d. Once the replica of the object d is stored at the storage node 224, the object d is stored by both erasure coding and replication in the system 200, resulting in a storage overhead of 2.4 for the object d.

Figure 2E:
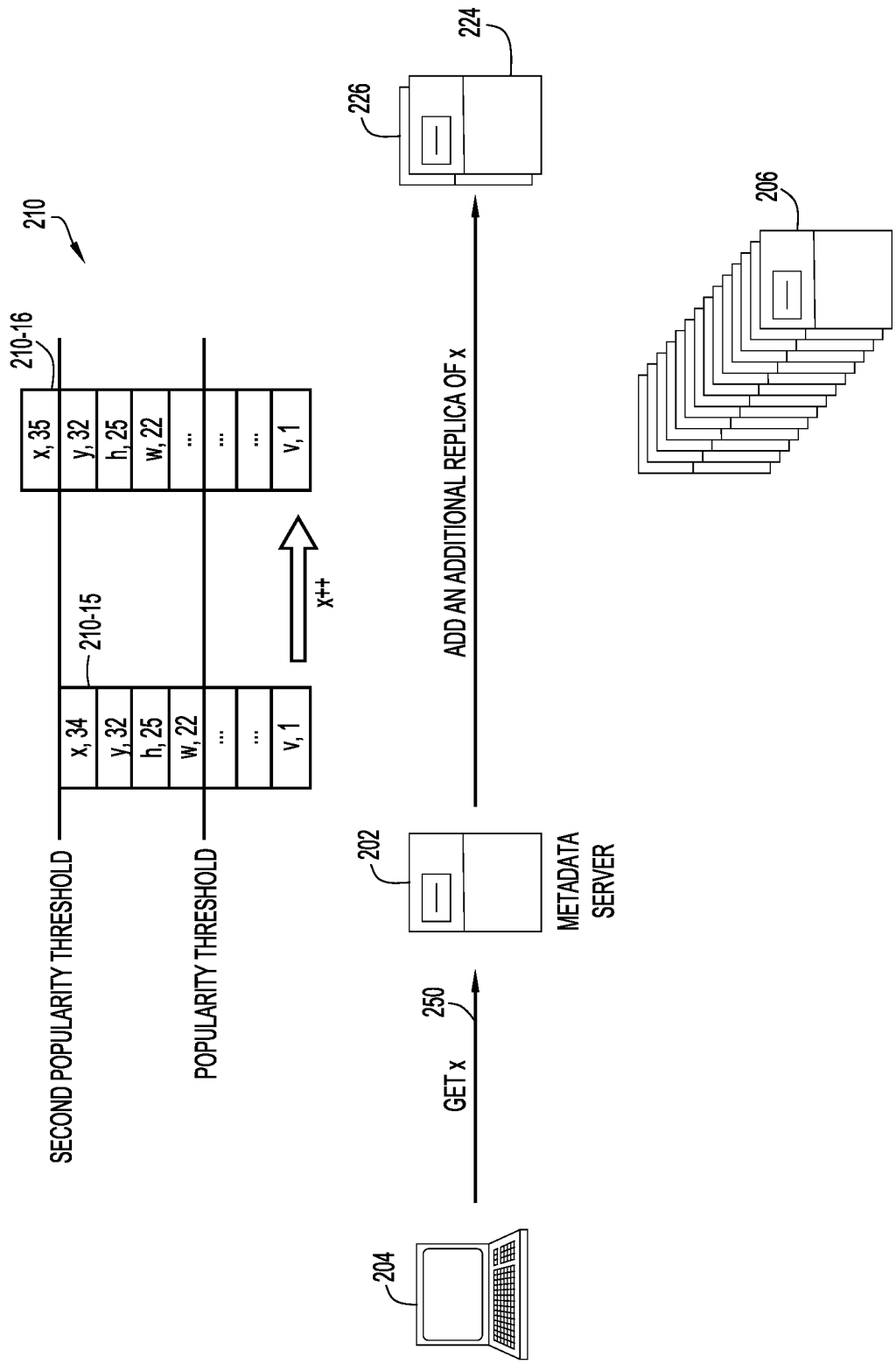

In some embodiments, a popularity policy may set a second popularity threshold above the popularity threshold (a first popularity threshold) for providing an improved user experience for extremely popular objects. When the popularity of an object is equal to or greater than the first popularity threshold, a first replica of the object is added, and when the popularity of the object is equal to or greater than the second popularity threshold, one additional (second) replica of the object is added to the storage system 200. FIG. 2E illustrates an example for such a policy. Before the server 202 receives a request 250 to retrieve object x from the client 204, the popularity database 210 maintained by the server 202 includes an entry 210-15 (x,34) indicating that the object x has been retrieved 34 times above the first popularity threshold (≥20) and below the second popularity threshold (≥35). Based on the popularity policy, at this time a replica of the object x at the storage node 224 and an erasure-coded copy at the storage nodes 206, are stored in the system 200. Upon receiving the request 250, the server 202 updates the popularity database 210 by adding an entry (x,35) 210-16 so that the popularity score of the object x is equal to the second popularity threshold. Based on the popularity policy, an additional replica of the object x is to be stored in the system 200. For example, the server 202 assigns another node at 252, e.g., storage node 254, to store the additional replica such that the system stores two replicas of the object x and an erasure-coded copy at nodes 206, resulting in a storage overhead of 3.4. In some embodiments, the server 202 may further delete the erasure-coded copy of the object x and add a third replica to the system 200, resulting in a storage overhead of 3. For example, the third replica may be stored in one of the nodes 206 or other storage nodes in the system 200.

It is to be understood that although one client, one server, and a limited number of storage nodes are illustrated in FIGS. 2A-2E, the present disclosure is not limited to these particular examples. Any suitable number of clients, servers, and storage nodes or clusters may be included in a storage system.

In one embodiment, when the server detects that the load of the storage nodes exceeds a predetermined level, i.e., a triggering event, the server may increase a popularity threshold such that less objects are stored by replication. In another embodiment, when the server detects that the load of the storage nodes is less than the predetermined level, the server may decrease the popularity threshold such that more objects are stored by replication, which facilitates the client's access to the objects.

In some embodiments, a storage policy may indicate that by default objects are replicated and stored in the system. When their popularity decreases, they are erasure coded and stored on slower devices. In some embodiments, a storage policy may indicate that objects requiring high performance have a replica on a fast storage device and are erasure coded on slower devices while objects that do not require high performance have a replica on regular devices and are erasure coded on slower devices. As such, a server can dynamically manage the storage of the objects to improve performance and reduce storage overheads.

Figure 3:
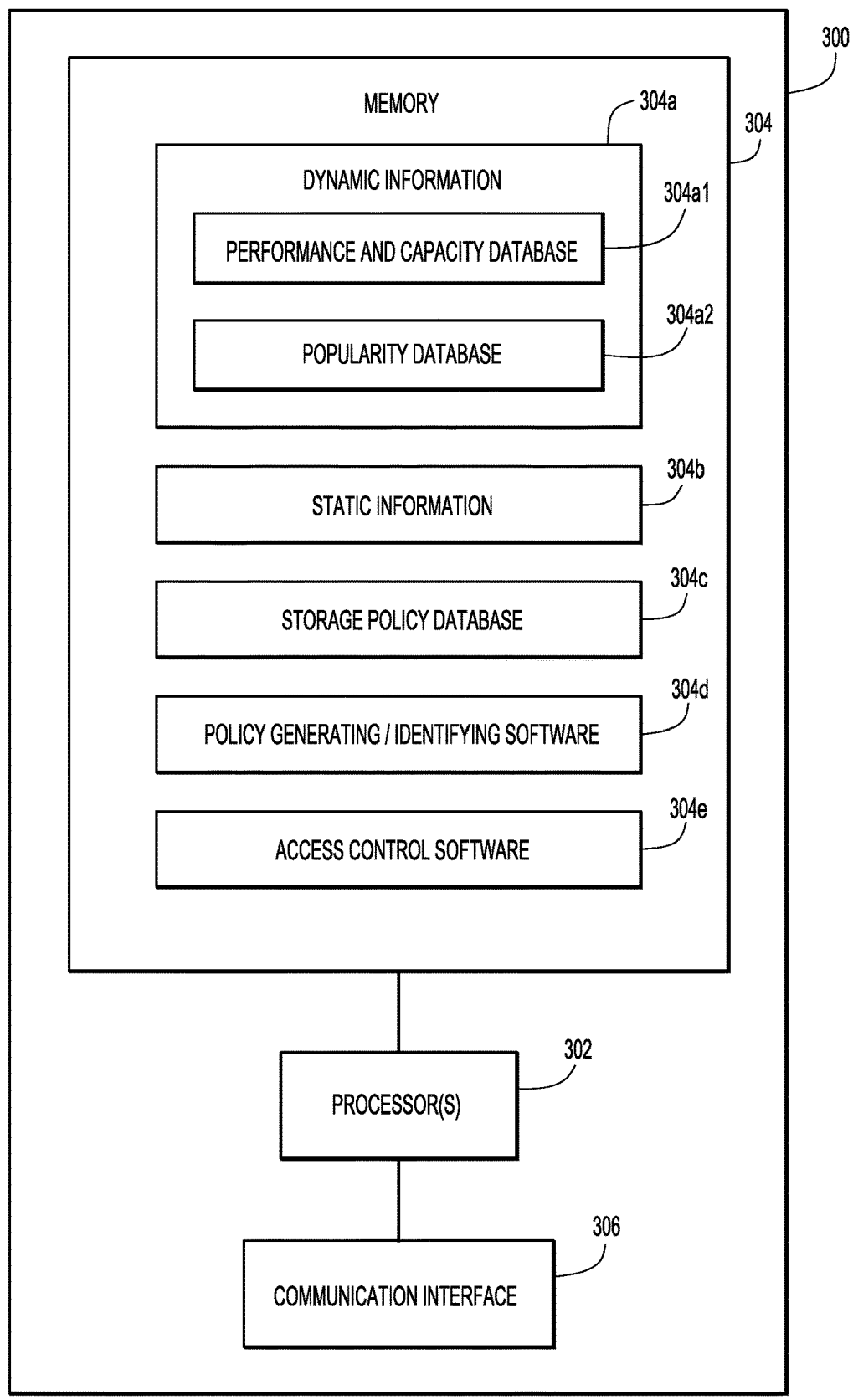
FIG. 3 depicts a block diagram of a server for managing storage and access requests for objects in a hybrid distributed storage system, according to one example embodiment.

FIG. 3 depicts a block diagram of a server 300 for managing storage of and access to objects in a hybrid storage system, according to one example embodiment. The server 300 shown in FIG. 3 may be representative of any of the servers 102 in FIG. 1 and the server 202 in FIG. 2. The server 300 includes a processor 302, a memory 304, and a communication interface 306. The processor 302 may be a microprocessor or microcontroller (or multiple instances of such components) that is configured to execute program logic instructions (i.e., software) for carrying out various operations and tasks described herein. For example, the processor 302 is configured to execute instructions stored in the memory 304 for restoring objects according to storage policy, receiving requests from clients for accessing/retrieving objects, detecting triggering events to dynamically determine a policy to change how objects are stored in the storage system, and other operations disclosed herein.

The memory 304 may include read only memory (ROM), random access memory (RAM), magnetic disk storage media devices, optical storage media devices, flash memory devices, electrical, optical or other physical/tangible memory storage devices. The memory 304 stores dynamic information 304a such as a performance and capacity database for storage nodes 304a1, an object popularity, a popularity database 304a2, an object update rate, a time since object creation, a cluster load, a storage node load, etc. for identifying or generating policies for objects; static information 304b such as an object size, an object type, an object reliability, object nature, an application-requested QoS for objects, predetermined read or write performance, etc. for identifying or generating policies for objects; a storage policy database 304c that includes policies for storing objects; policy generating/identifying software 304d for generating a new policy or identifying a suitable policy in response to a triggering event; and access control software 304e configured to manage client requests for accessing/retrieving objects.

The functions of the processor 302 may be implemented by logic encoded in one or more tangible (non-transitory) computer-readable storage media (e.g., embedded logic such as an application specific integrated circuit, digital signal processor instructions, software that is executed by a processor, etc.), wherein the memory 304 stores data used for the operations described herein and stores software or processor executable instructions that are executed to carry out the operations described herein.

In one embodiment, the processor 302 may be embodied by digital logic gates in a fixed or programmable digital logic integrated circuit, which digital logic gates are configured to perform storage and accessing control operations described herein. In general, the policy generating/identifying software 304d and the access control software 304e may be embodied in one or more computer-readable storage media encoded with software comprising computer executable instructions and when the software is executed operable to perform the operations described herein.

The communication interface 306 is configured to transmit communications to, and receive communications from, a computer network for the server 300. In one example, the communication interface 306 may take the form of one or more network interface cards.

Figure 4:
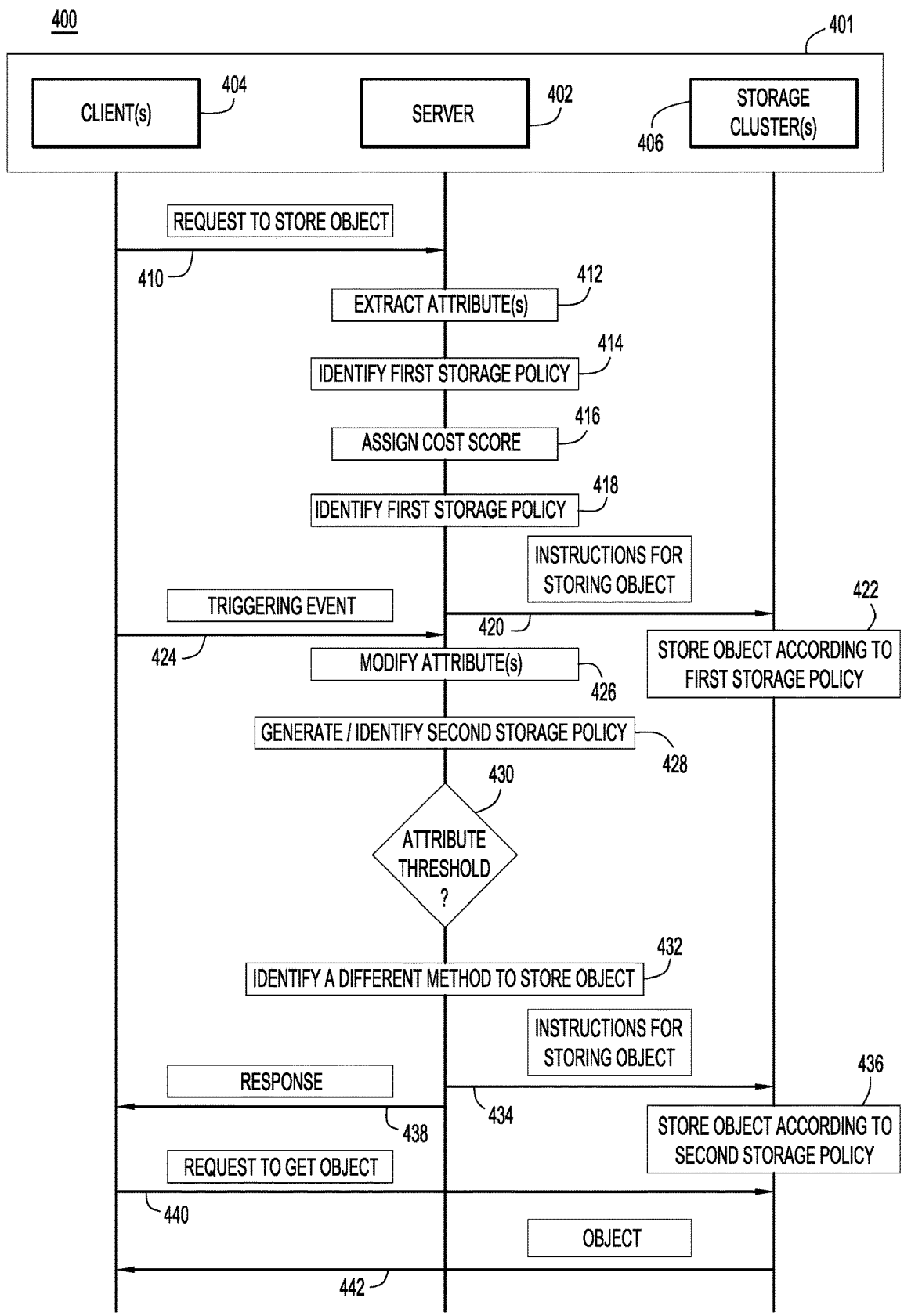
FIG. 4 is a flow chart illustrating a method for dynamically managing storage of objects in a hybrid distributed storage system, according to one example embodiment.

FIG. 4 is a flow chart illustrating a method 400 for dynamically managing storage of objects in a hybrid storage system 401, according to one example embodiment. The hybrid storage system 401 includes one or more servers 402 (only one server is illustrated as an example), one or more clients 404 (only one is illustrated as an example), and one or more storage clusters 406 (only one is illustrated as an example). The storage cluster 406 includes a plurality of storage nodes (not shown). The server 402 is configured to manage the manner an object is stored in the storage cluster 406 and resolve requests from the client 404. At 410, the client 404 sends to the server 402 a request for storing an object at the storage cluster 406. The object can be a file of any type of data, such as for example, a video, a document, a software application, an electronic book, a music file, an email, or any other kind of content. After receiving the request, at 412 the server 402 extracts one or more attributes of the object. For example, the server 402 may examine a header of the object to extract attributes of the object. Example attributes may include an object size, an object type, an object reliability, the nature of the object, an application-requested QoS, predetermined read or write performance for the object, and an existing popularity score of the object. At 414, based on the extracted attributes of the object, the server identifies a first storage policy for storing the object. For example, the server 402 may identify a policy based on the size of the object. In some embodiments, the first storage policy is a default storage policy that defines a cost structure for storing objects maintained by the storage cluster 406.

At 416, the server 402 assigns a cost score to the object based on the cost structure of the policy. For example, when the size of the object is small, the server 402 assigns a low cost score to the object, and when the size of the object is large, the server 402 assigns a high cost score. At 418, based on the cost score of the object, the server 402 identifies a method to store the object. For example, if the cost score of the object is equal to or greater than a threshold, the object is to be stored by erasure coding. If the cost score of the object is less than a threshold, the object is to be stored by replication. In some embodiments, a policy may include two different thresholds for determining a storage method for the object. For example, if the cost score of the object is less than a lower threshold, the object is to be stored by replication. If the cost score of the object is between the lower threshold and a higher threshold, the object is to be store by both replication and erasure coding. If the cost score of the object is equal to or greater than the higher threshold, the object is to be stored by erasure coding to reduce storage cost. At 420, once the server 402 determines a method to store the object, the server 402 transmits to the store cluster 406 instructions for storing the object. For example, the instructions may include a determined method (erasure coding, replication, or a combination thereof), a performance requirement (fast or slow response speed), a hardware requirement (solid state drive (SSD) or hard drive), identities of designated storage nodes to store the object, a storage overhead, etc. for the storage cluster 406 to successfully store the object. At 422, the storage cluster 406 stores the object based on the received instructions. In one embodiment, the server 402 may broadcast to the network that it has stored the object.

At 424, a triggering event is received at the server 402. The triggering event can be a request for retrieving an object. The request is transmitted from the client 404 or a different client to the server 402. Other dynamic parameters received at the server 402 can be a triggering event. Any event that changes one or more attributes of the object can be a triggering event. A reported downtime of the storage cluster 406 or a change in the cluster load or storage node load can also be a triggering event. In some embodiments, a triggering event associated with a dynamic parameter may come from any one of the server 402, the client 404, or the storage cluster 406.

Based on the triggering event, at 426 the server 402 modifies one or more attributes associated with the object. For example, based on a request for retrieving an object, the server 402 may update information such as a popularity score of the object, the latest time the object is requested, an identity of the requester for the object, a location of the requester, etc. In one embodiment, when the request is to retrieve the object, the server may increase a popularity score of the object as explained above in connection with FIG. 2B. In another embodiment, when the request is to retrieve a different object, the server may decrease the popularity score of the object as explained above in connection with FIG. 2D.

At 428, the server 402 generates a new policy or identifies a policy (second storage policy) based on the modified attribute(s) associated with the object. For example, when a popularity score of the object is modified, the server 402 generates a new policy or identifies a policy that governs the storage of objects based on their popularity scores. The popularity policy may include one or more threshold values for selecting a method (erasure coding, replication, or a hybrid of the two) for storing an object. At 430, the server 402 determines whether the modified attribute associated with the object is greater or less than a predetermined threshold of the second storage policy. For example, the server 402 determines whether the increased or decreased popularity score of the object is greater or less than a popularity threshold. An increased popularity score could result in the popularity score of the object moving from below the popularity threshold to above the popularity threshold. Conversely, a decreased popularity score could result in the popularity score of the object moving from being greater than the popularity threshold to being less than the popularity threshold.

At 432, based on the determination at 430, the server 402 determines a method to store the object. For example, based on the determination at 430, the server 402 determines whether the original method to store the object is still effective in cost and performance. If the server 402 determines that the original method to store the object is still effective, the server 402 determines the original method should be maintained. In some embodiments, the server 402 may determine that a new (different) storage method is to be employed to reduce cost or improve performance. For example, the server 402 may store an additional copy of the object at a fast response storage node if the increased popularity score of the object is equal to or greater than the popularity threshold. The server 402 may also delete an existing copy of the object if the reduced popularity score of the object is less than the popularity threshold. In one embodiment, if the increased popularity score of the object is equal to or greater than a second popularity threshold indicating that the object is extremely popular, the server 402 may store an additional copy of the object by replication at a fast response storage node.

At 434, once the server 402 determines a new method to store the object, the server 402 transmits to the store cluster 406 instructions for storing the object. The instructions indicate which new storage method or methods are to be used to store the object. At 436, the storage cluster 406 employs the new method(s) to store the object based on the received instructions.

At 438, the server 402 transmits a response to the client 404 if the triggering event is a request for retrieving the object. The response may include an address or identifier of the storage cluster 406 so that the client 404 can retrieve the object from the storage cluster 406. In some embodiments, the response may include addresses of the store nodes that store the object. At 440, based on the address or identifier of the storage cluster 406, the client 402 sends a request to retrieve the object to the storage cluster 406. At 442, in response to the request, the storage cluster 406 returns the requested object to the client 404.

Figure 5:
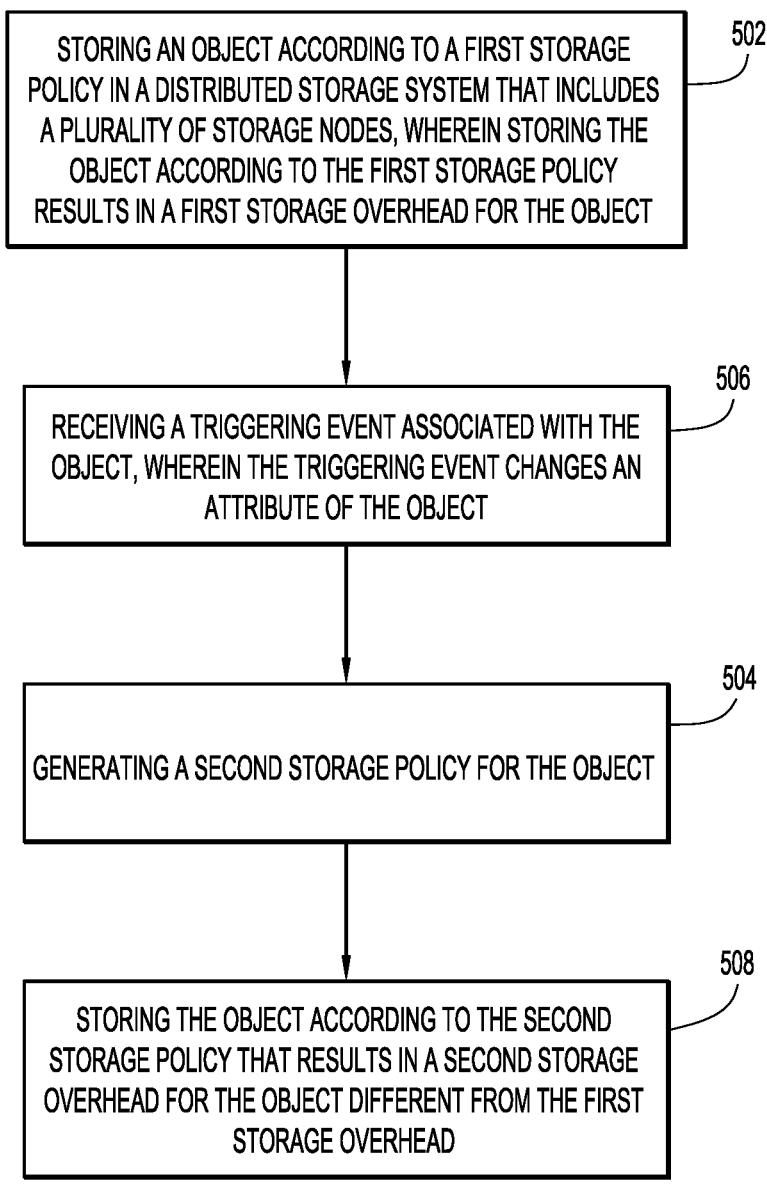
FIG. 5 is a flow chart illustrating a method performed by a server to manage storage of objects in a hybrid distributed storage system, according to one example embodiment.

FIG. 5 is a flow chart illustrating a method 500 performed by a server to manage storage of objects in a distributed storage system, according to one example embodiment. The server that performs the method 500 may be any one of the servers 102, 202, 300, or 402 referred to above. At 502, the server stores an object according to a first storage policy in the distributed storage system that includes a plurality of storage nodes. Storing the object according to the first storage policy results in a first storage overhead for the object. At 504, the server receives a triggering event associated with the object. The triggering event changes an attribute of the object. For example, the triggering event can be a request to retrieve the object or a different object such that the request changes a popularity score/attribute of the object. At 506, in response to the triggering event, the server identifies a second storage policy for the object. For example, if the popularity score of the object is changed by the triggering event, the server may identify a policy associated with popularity of the objects managed by the server. At 508, the server stores the object according to the second storage policy that results in a second storage overhead for the object different from the first storage overhead. In some embodiments, these techniques allow the server to dynamically manage the storage of objects to reduce storage overhead in the system to save storage cost or to increase storage overhead ultimately for the purpose of improving the performance of the storage system.

Figure 6:
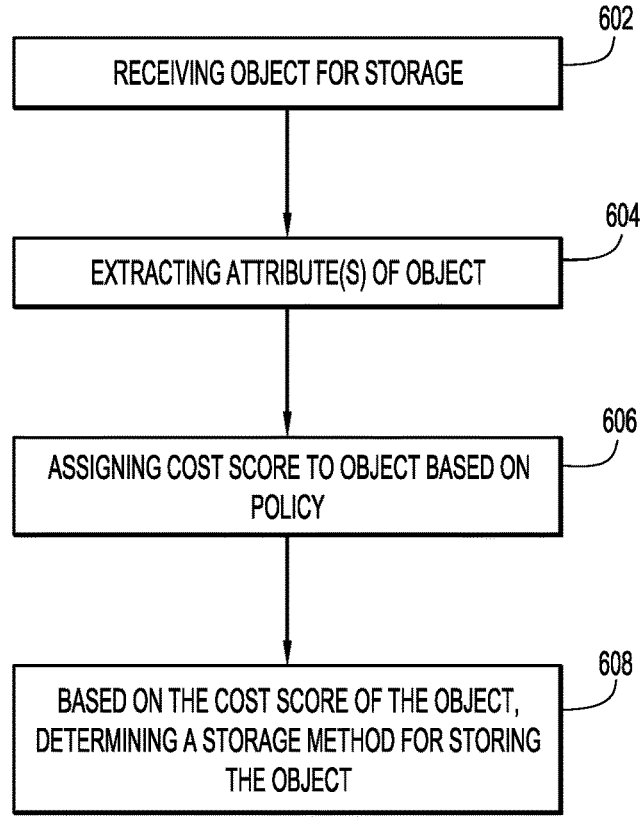
FIG. 6 is a flow chart illustrating a method performed by a server to store objects in a hybrid distributed storage system, according to one example embodiment.

FIG. 6 is a flow chart illustrating a method 600 performed by a server to store objects in a distributed storage system, according to one example embodiment. The server that performs method 600 may be any one of the servers 102, 202, 300, or 402 referred to above. At 602, the server receives an object for storage at the distributed storage system. Again, the object can be a file of any type of data, such as a video, a document, a software application, an electronic book, a music file, an email, or any other kind of content. At 604, the server extracts one or more attributes of the object. The attributes of the object may include a name or identifier of the object, a size of the object, a source address, content of the object, a popularity score of the object, a time the object is created, a time when the object was last modified, a predetermined QoS, etc. At 606, based on one or more attributes of the object, the server identifies a policy that assigns a cost score to the object. In some embodiments, the policy is a default policy for any new objects assigned to the server. For example, the server may assign a cost score to the object based on the object size. At 608, the server determines a storage method for storing the object based on the cost score assigned to the object. For example, the policy for the server may include a threshold. If the cost score of the object exceeds the threshold, the object is to be stored by erasure coding to reduce the cost to store the object. If the cost score of the object does not exceed the threshold, the object is to be stored by replication, e.g., two or three replicas of the object.

Figure 7:
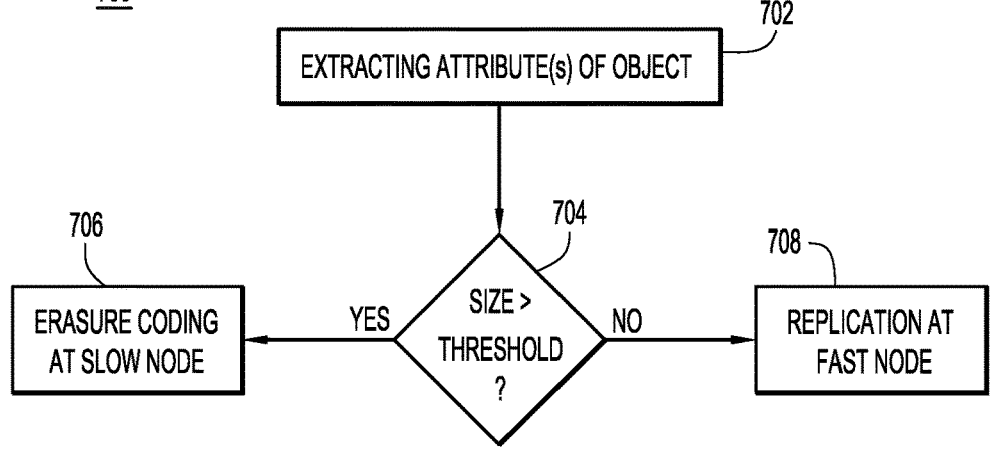
FIG. 7 is a flow chart illustrating a method performed by a server to store objects in a hybrid distributed storage system based on sizes of the objects, according to one example embodiment.

FIG. 7 is a flow chart illustrating a method 700 performed by a server to store objects in a distributed storage system based on the sizes of the objects, according to one example embodiment. The server that performs method 700 may be any one of the servers 102, 202, 300, or 402 referred to above. At 702, after receiving an object for storage in the distributed storage system, the server extracts one or more attributes of the object. In this embodiment, the server determines the size of the object. At 704, the server determines whether the size of the object exceeds a size threshold associated with a storage policy. If the size of the object exceeds the size threshold (Yes at 704), at 706 the server determines that the object is to be stored by erasure coding at nodes having a slow response speed. Because erasure coding is associated with lower storage overhead, storing a larger-sized object according to this method can save cost. If the size of the object does not exceed the size threshold (No at 704), at 708 the server determines that the object is to be stored by replication at nodes having fast response speed. Although storing an object by replication could potentially increase storage overhead, replicas of the object allow a user/client who consumes/retrieves the object to have a direct access to the object, which may improve the user experience in the system.

Figure 8:
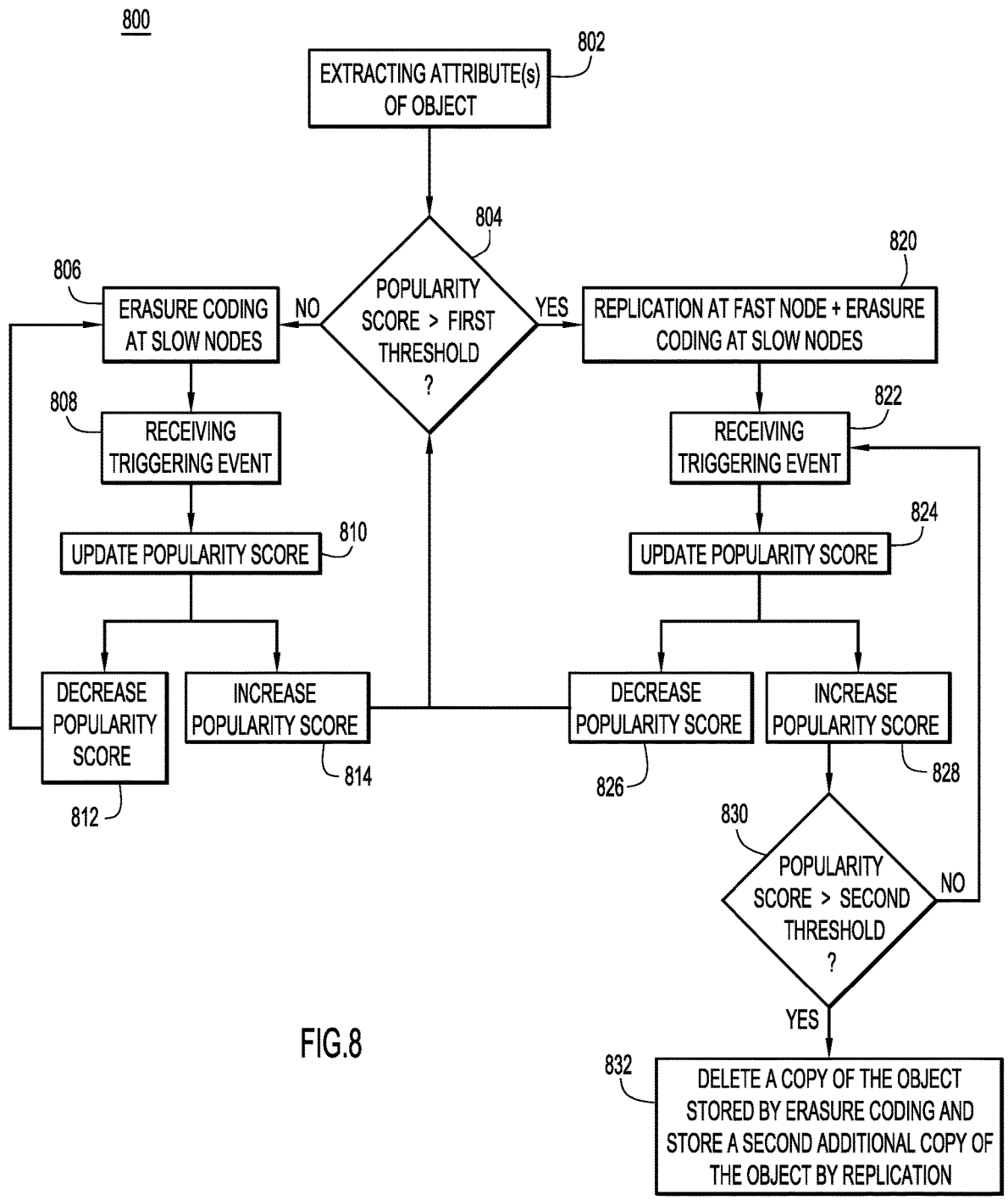
FIG. 8 is a flow chart illustrating a method performed by a server to dynamically change operations to store objects in a hybrid distributed storage system based on popularity of the objects, according to one example embodiment.

FIG. 8 is a flow chart illustrating a method 800 performed by a server to dynamically change methods to store objects in a distributed storage system based on popularity of the objects, according to one example embodiment. Again, the server that performs may be any one of the servers 102, 202, 300, or 402 referred to above. At 802, upon receiving an object for storage at the distributed storage system, the server extracts one or more attributes of the object. In this embodiment, the server extracts popularity information, such as a popularity score, of the object. At 804, the server determines whether the popularity score of the object exceeds a first popularity threshold associated with a popularity policy. If the popularity score of the object does not exceed the first popularity threshold (No at 804), at 806 the server stores the object by erasure coding at storage nodes in communication with the server, resulting in a storage overhead of, for example, 1.4 for the object. At 808, the server receives a triggering event associated with the object. In one embodiment, the triggering event is a request for retrieving the object. In another embodiment, the triggering event is a request for retrieving a different object. At 810, based on the triggering event, the server updates the popularity score of the object. At 812, if the triggering event is a request for retrieving a different object, the server decreases the popularity score of the object. The process then returns to 806 where the method for storing the object remains to be erasure coding. At 814, if the triggering event is a request for retrieving the object, the server increases the popularity score of the object. The process then returns to 804 for the server to again determine whether the increased popularity score of the object now exceeds the first popularity threshold.

If the popularity score of the object exceeds the first popularity threshold (Yes at 804), at 820 the server stores a copy of the object by erasure coding and a copy of the object by replication. In some embodiments, the erasure-coded copy may be stored at storage nodes having a slow response speed and the replica of the object may be stored at a node having a fast response speed.

At 822, the server receives another triggering event associated with the object. Similar to the process at 808, the triggering event may be a request for retrieving the object or a different object. At 824, in response to receiving the triggering event, the server updates the popularity score of the object. At 826, if the triggering event is a request for retrieving a different object, the server decreases the popularity score of the object. The process then returns to 804 for the server to again determine whether the decreased popularity score of the object still exceeds the first popularity threshold. At 828, if the triggering event is a request for retrieving the object, the server increases the popularity score of the object, and the process moves to 830.

At 830, the server determines whether the increased popularity score of the object exceeds a second popularity threshold higher than the first popularity threshold. If the increased popularity score of the object does not exceed the second popularity threshold, the process returns to 822 to wait for another triggering event. If the increased popularity score of the object exceeds the second popularity threshold, at 832 the server deletes a copy of the object stored by erasure coding and stores a second additional copy of the object by replication. At this point, the storage system has two replicas of the object and no erasure-coded copy of the object, resulting in a storage overhead of 2 for the object. In some embodiments, at 832 the server may delete a copy of the object stored by erasure coding and store two additional copies of the object by replication. When this occurs, the storage system has three replicas of the object and no erasure-coded copy of the object, resulting in a storage overhead of 3 for the object.

The techniques presented herein allow a server to dynamically and reactively improve the efficiency of distributed storage systems, for example, by adapting to heterogeneous object popularity. In some embodiments, a server may determine popularity of objects with a cost function that may be based on well-established mechanisms such as web caches and a content delivery network. The server is configured to manage the internal cluster representation of objects according to the determined popularity or to any other metrics. In some embodiments, the server may dynamically manage the manner by which objects are stored at the distributed storage system to maintain a low storage overhead. In some embodiments, when 20% of the objects stored in the cluster amount for 80% of the requests, the techniques applied with erasure codes provide an overall storage overhead of 1.6 while guaranteeing the same quality of service for object retrieval as a storage cluster with a storage overhead of 3 in 80% of the cases.

In some embodiments, the techniques provide a way to dynamically adjust the internal representation of objects in distributed storage clusters according to one or more policies. A policy could have dynamic adaptability to, for example, object popularity. A storage cluster may guarantee high performance for the vast majority of requests while maintaining a low storage overhead, resulting in a higher average performance/cost ratio.

In some embodiments, the techniques employ a cost function associated with one or more attributes of an object including but not limited to popularity. The cost function may be domain specific and may also depend on different object characteristics such as a size or data type of objects. The techniques associate a storage policy to categories of objects. The storage policy controls default object representation (erasure coding, replicas, or both) and reactively switches between object representations based on triggering events. For example, a policy defines that an object initially be stored in erasure-coding representation with an additional full replica to maximize read performance and to save computing and network resources that would be required to access the object in erasure-coded form. The particular event that triggers the transition between the different representations or the coexistence of different representations can be defined by the policy.

In one form, a method is provided, which includes: storing, by a server, an object according to a first storage policy in a distributed storage system that includes a plurality of storage nodes, wherein storing the object according to the first storage policy results in a first storage overhead for the object; receiving a triggering event associated with the object, wherein the triggering event changes an attribute of the object; in response to the triggering event, identifying a second storage policy for the object; and storing the object according to the second storage policy that results in a second storage overhead for the object different from the first storage overhead.

In some embodiments, the first storage policy is a default storage policy that defines a cost structure for storing objects maintained by the plurality of storage nodes. The method further includes: upon receipt of the object by the server, assigning a cost score to the object based on the cost structure; and based on the cost score of the object, determining a storage method for storing the object.

In some embodiments, the first storage policy indicates: when a size of the object is greater than a size threshold, the object is stored by erasure coding; and when the size of the object is equal to or less than the size threshold, the object is stored by replication.

In some embodiments, the triggering event changes the attribute of the object such that the attribute of the object is greater or less than a predetermined threshold; and in response to the triggering event, storing the object according to the second storage policy includes the server storing an additional copy or deleting an existing copy of the object.

In some embodiments, the additional copy of the object is stored at a first storage node having a response speed greater than a second storage node that stores the existing copy.

In some embodiments, the triggering event is a client request to retrieve the object. The attribute of the object is a popularity score of the object. Receiving the client request increases the popularity score of the object such that the popularity score of the object exceeds a popularity threshold. In response to the client request, storing the object according to the second storage policy for the object includes the server storing an additional copy of the object by replication such that the second storage overhead for the object is greater than the first storage overhead.

In some embodiments, the client request is a first client request and the popularity threshold is a first popularity threshold. The method further includes: receiving a second client request to retrieve the object; receiving the second client request increases the popularity score of the object such that the popularity score of the object exceeds a second popularity threshold; and in response to the second client request, storing the object according to the second storage policy for the object includes the server deleting a copy of the object stored by erasure coding and storing a second additional copy of the object by replication such that the second storage overhead for the object is greater than the first storage overhead.

In some embodiments, the object is a first object; the triggering event is a client request to retrieve a second object different from the first object; and the attribute of the object is a popularity score of the first object. Receiving the client request decreases the popularity score of the first object such that the popularity score of the first object is less than the popularity threshold. In response to the client request, storing the object according to the second storage policy for the object includes the server deleting a copy of the first object stored by replication such that the second storage overhead for the object is less than the first storage overhead.

In another form, an apparatus is provided. The apparatus includes a network interface that enables network communications, a processor, and a memory to store data and instructions executable by the processor. The processor is configured to execute the instructions to: store an object according to a first storage policy in a distributed storage system that includes a plurality of storage nodes, wherein storing the object according to the first storage policy results in a first storage overhead for the object; receive a triggering event associated with the object, wherein the triggering event changes an attribute of the object; in response to the triggering event, identify a second storage policy for the object; and store the object according to the second storage policy that results in a second storage overhead for the object different from the first storage overhead.

In yet another form, a non-transitory computer-readable storage medium is provided. The non-transitory computer-readable storage medium is encoded with software comprising computer executable instructions which, when executed by a processor, cause the processor to: store an object according to a first storage policy in a distributed storage system that includes a plurality of storage nodes, wherein storing the object according to the first storage policy results in a first storage overhead for the object; receive a triggering event associated with the object, wherein the triggering event changes an attribute of the object; in response to the triggering event, identify a second storage policy for the object; and store the object according to the second storage policy that results in a second storage overhead for the object different from the first storage overhead.

The above description is intended by way of example only. The present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Although the techniques are illustrated and described herein as embodied in one or more specific examples, it is nevertheless not intended to be limited to the details shown, since various modifications and structural changes may be made within the scope and range of equivalents of this disclosure.

What is claimed is:

1. A method comprising:
    storing, by a server, an object according to a first storage policy in a distributed storage system that includes a plurality of storage nodes, the storage policy specifying one or a combination of replication and erasure coding to redundantly store the object, wherein storing the object according to the first storage policy results in a first storage overhead for the object;
    determining a popularity of the object based on a number of client requests for retrieval of the object, wherein the popularity of the object is specified by a popularity score that is updated in response to receipt of a client request for retrieval of the object;
    in response to a change in the popularity of the object indicated by the popularity score crossing a popularity threshold, changing from the first storage policy to a second storage policy for the object; and
    storing the object according to the second storage policy that results in a second storage overhead for the object different from the first storage overhead due to the second storage policy specifying a different combination of replication and erasure coding from the first storage policy or by specifying one of replication and erasure coding not specified by the first storage policy wherein the object is stored by erasure coding in response to the popularity score being below the popularity threshold, and the object is stored by replication in response to the popularity score being above the popularity threshold.

2. The method of claim 1, wherein the first storage policy indicates:
    when a size of the object is greater than a size threshold, the object is stored by erasure coding; and
    when the size of the object is equal to or less than the size threshold, the object is stored by replication.

3. The method of claim 1, wherein:
    the popularity threshold is a first popularity threshold that is lower than a second popularity threshold;
    the object is stored by erasure coding in response to the popularity score being below the first popularity threshold;
    the object is stored by replication in response to the popularity score being above the second popularity threshold; and
    the object is stored by a combination of replication and erasure coding in response to the popularity score being between the first and second popularity thresholds.

4. The method of claim 1, wherein:
    the popularity score of the object is evaluated relative to popularity scores of other objects to determine whether updating the popularity score causes the popularity score to cross the popularity threshold.

5. The method of claim 1, wherein the client request is a first client request, the popularity threshold is a first popularity threshold, and the method further comprises:
    receiving a second client request to retrieve the object;
    receiving the second client request increases the popularity score of the object such that the popularity score of the object exceeds a second popularity threshold; and
    in response to the second client request, storing the object according to the second storage policy for the object includes the server deleting a copy of the object stored by erasure coding and storing a second additional copy of the object by replication such that the second storage overhead for the object is greater than the first storage overhead.

6. The method of claim 1, wherein:
the object is a first object and, in response to receipt of a second client request for retrieval of a second object different from the first object, the method further comprises:
decreasing the popularity score of the first object such that the popularity score of the first object is less than the popularity threshold; and
storing the first object according to the second storage policy for the first object includes the server deleting a copy of the first object stored by replication such that the second storage overhead for the first object is less than the first storage overhead.

7. An apparatus comprising:
a network interface that enables network communications;
a processor; and
a memory to store data and instructions executable by the processor,
wherein the processor is configured to execute the instructions to:
store an object according to a first storage policy in a distributed storage system that includes a plurality of storage nodes, the storage policy specifying one or a combination of replication and erasure coding to redundantly store the object, wherein storing the object according to the first storage policy results in a first storage overhead for the object;
determine a popularity of the object based on a number of client requests for retrieval of the object, the popularity of the object being specified by a popularity score that is updated in response to receipt of the client requests for retrieval of the object;
in response to a change in the popularity of the object indicated by the popularity score crossing a popularity threshold, change from the first storage policy to a second storage policy for the object; and
store the object according to the second storage policy that results in a second storage overhead for the object different from the first storage overhead due to the second storage policy specifying a different combination of replication and erasure coding from the first storage policy or by specifying one of replication and erasure coding not specified by the first storage policy, wherein the object is stored by erasure coding in response to the popularity score being below the popularity threshold, and the object is stored by replication in response to the popularity score being above the popularity threshold.

8. The apparatus of claim 7, wherein the first storage policy indicates:
when a size of the object is greater than a size threshold, the object is stored by erasure coding; and
when the size of the object is equal to or less than the size threshold, the object is stored by replication.

9. The apparatus of claim 7, wherein the popularity threshold is a first popularity threshold that is lower than a second popularity threshold and the processor is configured to execute the instructions to:
store the object by erasure coding in response to the popularity score being below the first popularity threshold;
store the object by replication in response to the popularity score being above the second popularity threshold; and
store the object by a combination of replication and erasure coding in response to the popularity score being between the first and second popularity thresholds.

10. The apparatus of claim 7, wherein
the processor is configured to evaluate the popularity score of the object relative to popularity scores of other objects to determine whether updating the popularity score causes the popularity score to cross the popularity threshold.

11. The apparatus of claim 7, wherein the client request is a first client request, the popularity threshold is a first popularity threshold, and the processor is further configured to:
receive a second client request to retrieve the object;
in response to receiving the second client request, increase the popularity score of the object such that the popularity score of the object exceeds a second popularity threshold; and
store the object according to the second storage policy for the object by deleting a copy of the object stored by erasure coding and storing a second additional copy of the object by replication such that the second storage overhead for the object is greater than the first storage overhead.

12. The apparatus of claim 7, wherein:
the object is a first object; and,
in response to receipt of a second client request for retrieval of a second object different from the first object, the processor is configured to:
decrease the popularity score of the first object such that the popularity score of the first object is less than the popularity threshold; and
delete a copy of the first object stored by replication such that the second storage overhead for the first object is less than the first storage overhead.

13. A non-transitory computer-readable storage medium encoded with software comprising computer executable instructions which, when executed by a processor, cause the processor to:
store an object according to a first storage policy in a distributed storage system that includes a plurality of storage nodes, the storage policy specifying one or a combination of replication and erasure coding to redundantly store the object, wherein storing the object according to the first storage policy results in a first storage overhead for the object;
determine a popularity of the object based on a number of client requests for retrieval of the object, the popularity of the object being specified by a popularity score that is updated in response to receipt of the client requests for retrieval of the object;
in response to a change in the popularity of the object indicated by the popularity score crossing a popularity threshold, change from the first storage policy to a second storage policy for the object; and
store the object according to the second storage policy that results in a second storage overhead for the object different from the first storage overhead due to the second storage policy specifying a different combination of replication and erasure coding from the first storage policy or by specifying one of replication and erasure coding not specified by the first storage policy wherein the object is stored by erasure coding in response to the popularity score being below the popularity threshold, and the object is stored by replication in response to the popularity score being above the popularity threshold.

14. The non-transitory computer-readable storage medium of claim 13, wherein the first storage policy indicates:
when a size of the object is greater than a size threshold, the object is stored by erasure coding; and
when the size of the object is equal to or less than the size threshold, the object is stored by replication.

\* \* \* \* \*